(12) United States Patent  
Chen et al.

(10) Patent No.: US 6,996,000 B2  
(45) Date of Patent: Feb. 7, 2006

(54) NON-VOLATILE FERROELECTRIC SRAM

(75) Inventors: Zheng Chen, Colorado Springs, CO (US); Carlos A. Paz de Araujo, Colorado Springs, CO (US); Larry D. McMillan, Colorado Springs, CO (US)

(73) Assignees: Symetrix Corporation, Colorado Springs, CO (US); Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/961,429

(22) Filed: Oct. 7, 2004

(65) Prior Publication Data

US 2005/0073876 A1 Apr. 7, 2005

Related U.S. Application Data

(60) Provisional application No. 60/509,393, filed on Oct. 7, 2003.

(51) Int. Cl.  
*G11C 7/00* (2006.01)

(52) U.S. Cl. ..................................... 365/154; 365/145
(58) Field of Classification Search ................ 365/154, 365/145, 149
See application file for complete search history.

(56) References Cited

U.S. PATENT DOCUMENTS

| 4,809,225 | A | 2/1989 | Dimmler et al. |
| 6,731,530 | B2 * | 5/2004 | Miwa et al. ................. 365/145 |
| 2004/0141363 | A1 * | 7/2004 | Ohtsuka et al. ............. 365/154 |
| 2004/0196689 | A1 * | 10/2004 | Ohtsuka et al. ............. 365/154 |

* cited by examiner

*Primary Examiner*—Vu A. Le  
(74) *Attorney, Agent, or Firm*—Patton Booge LLP

(57) ABSTRACT

A non-volatile SRAM memory comprising a plurality of memory cells, each memory cell including a SRAM memory cell portion and a ferroelectric memory cell portion including a ferroelectric element, the ferroelectric memory cell portion including a switch system for permitting the ferroelectric element to be isolated from the ferroelectric elements in all other memory cells.

15 Claims, 3 Drawing Sheets

NON-VOLATILE FERROELECTRIC SRAM

RELATED APPLICATIONS

This patent application claims the benefit of U.S. Provisional Patent Application No. 60/509,393 filed Oct. 7, 2003, which provisional patent application is hereby incorporated by reference to the same extent as though fully disclosed herein.

BACKGROUND OF THE INVENTION

1. Field of the Invention

The invention in general relates to ferroelectric non-volatile memories, and in particular such a memory that is generally known as a ferroelectric static random access memory (SRAM).

2. Statement of the Problem

Static random access memories (SRAMs) are well-known in the art. SRAMs are referred to as "static", because unlike dynamic RAMs (DRAMs) they do not have to be refreshed; they use an electronic latch which retains its memory state so long as electricity is applied to it. It is also significantly faster than a DRAM. However, like a DRAM, it is volatile and loses its data when electrical power is removed or lost.

Non-volatile SRAMs have been proposed. See, for example, U.S. Pat. No. 4,809,225, which is incorporated herein by reference to the same extent as though fully disclosed herein. In this type of memory, each memory cell includes a SRAM latch portion and a ferroelectric memory portion. The ferroelectric portion is non-volatile. The data held by the SRAM portion of the cell is transferred to the corresponding ferroelectric portion when the power is turned off or lost. When the power returns, the data held by the ferroelectric portion is transferred back to the SRAM latch. During normal SRAM operation, the ferroelectric portion is isolated from the SRAM latch portion to avoid ferroelectric fatigue.

While the volatile SRAMs have gained wide commercial acceptance for field stand-alone memories, cache memories, and programmable gate array (FPGA) applications, up until now non-volatile SRAMs have not been commercialized. This is due to the fact that the prior art non-volatile SRAMS have been susceptible to ferroelectric disturb. Ferroelectric disturb occurs when the reading and/or writing to one ferroelectric cell causes a small voltage to be applied to neighboring ferroelectric cells. While the small voltage is not sufficient to alter the memory states of the neighboring cells, it has been found in practice that many such small voltages can eventually cause loss of data. Disturb can also occur when one ferroelectric cell is connected to a ferroelectric cell having a different memory state for relatively long periods, which disturb was not anticipated by those skilled in the art. Since SRAMs typically may be off for relatively long periods, this latter disturb aspect has been particularly a problem in the prior art non-volatile SRAM memories. Thus, a memory that was intended to be extremely reliable turned out not to be very reliable in practice. Thus, it would be highly desirable to have a non-volatile SRAM that was not susceptible to ferroelectric disturb and, as a result, was highly reliable.

SUMMARY OF THE INVENTION

The invention provides a solution to the above problem by providing a non-volatile SRAM in which each of the ferroelectric elements are isolatable from all other ferroelectric elements. Preferably, the invention provides one or more switches that separate the ferroelectric elements. In the preferred embodiment, there are no more transistors in the non-volatile SRAM according to the invention than in the prior art non-volatile SRAMs; thus, the inventive memory is more reliable while equally as dense as the prior art memories.

The invention provides a non-volatile memory comprising a plurality of memory cells, each memory cell including: a SRAM memory cell portion and a ferroelectric memory cell portion including a ferroelectric element; the memory including a data transfer circuit for transferring data from the SRAM cell portion to the ferroelectric memory cell portion when the memory is turned off and for transferring data from the ferroelectric memory cell portion to the SRAM memory cell when the memory is turned on; and the ferroelectric memory cell portion including a switch system for isolating the ferroelectric element from the ferroelectric elements in all other of the memory cells when the data is not being transferred. Preferably, the ferroelectric element is a capacitor. Preferably, the switch system comprises a transistor. Preferably, each of the ferroelectric memory cell portions include a first ferroelectric capacitor, a second ferroelectric capacitor, a first switch and a second switch, and wherein the first switch isolates the first ferroelectric capacitor and the second switch isolates the second ferroelectric capacitor. Preferably, the first ferroelectric capacitor and the first switch are connected in parallel, and the second ferroelectric capacitor and the second switch are connected in parallel. Preferably, the first ferroelectric capacitor and the first switch are connected in series, and the second ferroelectric capacitor and the second switch are connected in series. Preferably, the memory includes a plate line and the switch is connected between the ferroelectric element and the plate line.

In another aspect, the invention provides a non-volatile memory comprising a plurality of memory cells, each memory cell including: a SRAM memory cell portion and a ferroelectric memory cell portion including a ferroelectric element, the ferroelectric memory cell portion including a switch system for permitting the ferroelectric element to be isolated from the ferroelectric elements in all other of the memory cells. Preferably, the ferroelectric element is a capacitor and the switch system comprises a transistor.

In a further aspect, the invention provides a non-volatile memory comprising a plurality of memory cells, each memory cell including: a SRAM memory cell portion and a ferroelectric memory cell portion including a ferroelectric element; the memory including a data transfer circuit for transferring data from the SRAM cell portion to the ferroelectric memory cell portion when the memory is turned off and for transferring data from the ferroelectric memory cell portion to the SRAM memory cell when the memory is turned on; and the ferroelectric memory cell portion including a switch system for creating a short circuit across the ferroelectric element when the SRAM portion is operating normally. Preferably, the ferroelectric element is a capacitor. Preferably, the switch system comprises a transistor.

The invention also provides a method of operating a non-volatile SRAM memory cell in a memory containing a plurality of the cells, the method comprising: providing a SRAM memory cell portion and a ferroelectric memory cell portion including a ferroelectric element; transferring data between the SRAM memory cell portion and the ferroelectric memory cell portion; and isolating the ferroelectric element from all other ferroelectric elements in the memory when the data is not being transferred. Preferably, the ferroelectric element is a ferroelectric capacitor having two electrodes, the method further including shorting out the two electrodes of the ferroelectric element while the SRAM portion is operating normally.

The invention further provides a method of recalling data in a non-volatile memory, the method comprising: providing a non-volatile memory cell comprising a SRAM memory cell portion and a ferroelectric memory cell portion including a ferroelectric element; transferring data from the SRAM memory cell portion to the ferroelectric memory cell portion when the memory is powered down; transferring data from the ferroelectric memory cell portion to the SRAM memory cell portion when the memory is powered up in a manner such that the ferroelectric memory cell portion no longer retains the data; and automatically writing the data back to the ferroelectric memory cell portion.

The invention not only provides a non-volatile SRAM memory that is more reliable than the prior art memories, but does so with a memory that is simpler in architecture. Numerous other features, objects and advantages of the invention will become apparent from the following description when read in conjunction with the accompanying drawings.

DETAILED DESCRIPTION OF THE PREFERRED EMBODIMENT

Figure 1:
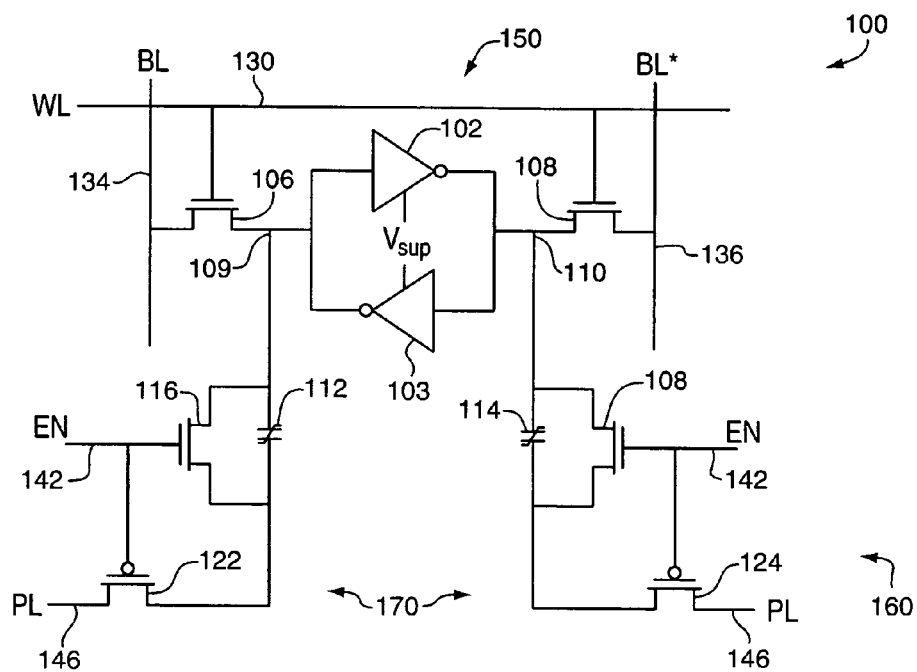
FIG. 1 is an electrical circuit diagram of a preferred embodiment of a non-volatile ferroelectric memory cell according to the invention.

FIG. 1 is an electrical circuit diagram of a preferred embodiment of a non-volatile ferroelectric memory cell 100 according to the invention. Memory cell 100 includes a SRAM latch portion 150 and a ferroelectric portion 160. SRAM latch portion 150 includes inverters 102 and 103, and transistors 106 and 108. The output of inverter 102 is connected to the input of inverter 103 and node 110; the output of inverter 103 is connected to the input of inverter 102 and node 109. The gates of transistors 106 and 108 are connected to word line 130. One source/drain of transistor 106 is connected to bit line 134 while the other source/drain is connected to node 109. One source/drain of transistor 108 is connected to bit line 136 while the other source/drain is connected to node 110. As known in the art, bit lines 134 and 136 are complementary. Inverters 102 and 103 may be implemented in any conventional manner, and preferably are implemented by four transistors as known in the art. Ferroelectric portion 160 includes ferroelectric capacitors 112 and 114, and switches 116, 118, 122, and 124. Preferably, switches 116 and 118 are n-channel MOSFETS and switches 122 and 124 are p-channel MOSFETS, though other types of transistors are possible. One electrode of capacitor 112 is connected to node 109 and to one source/drain of transistor 116. The other electrode of capacitor 112 is connected to the other source/drain of transistor 116 and to one source/drain of transistor 122. The other source/drain of transistor 122 is connected to a plate signal source 146. The gates of transistors 116 and 122 are connected to an enable signal source 142. One electrode of capacitor 114 is connected to node 110 and to one source/drain of transistor 118. The other electrode of capacitor 114 is connected to the other source/drain of transistor 118 and to one source/drain of transistor 124. The other source/drain of transistor 124 is connected to a plate signal source 146. The gates of transistors 116 and 122 are connected to an enable signal source 142. When the enable signal EN is high, transistors 116 and 118 are turned on, while transistors 122 and 124 are turned off; when EN is low, transistors 116 and 118 are turned off, while transistors 122 and 124 are turned on. As known in the art, inverters 102 and 103 are connected to the power supply voltage, which we designate as $V_{sup}$. As indicated above, transistor 116 and capacitor 112 are connected in parallel, and transistor 118 and capacitor 114 are connected in parallel in this embodiment. Capacitors 122 and 124 comprise a switch system 170 for isolating ferroelectric capacitors 112 and 114 from all other ferroelectric capacitors in the memory 500 (FIG. 5) when data is not being transferred between the ferroelectric portion 160 and the SRAM portion 150.

Figure 2:
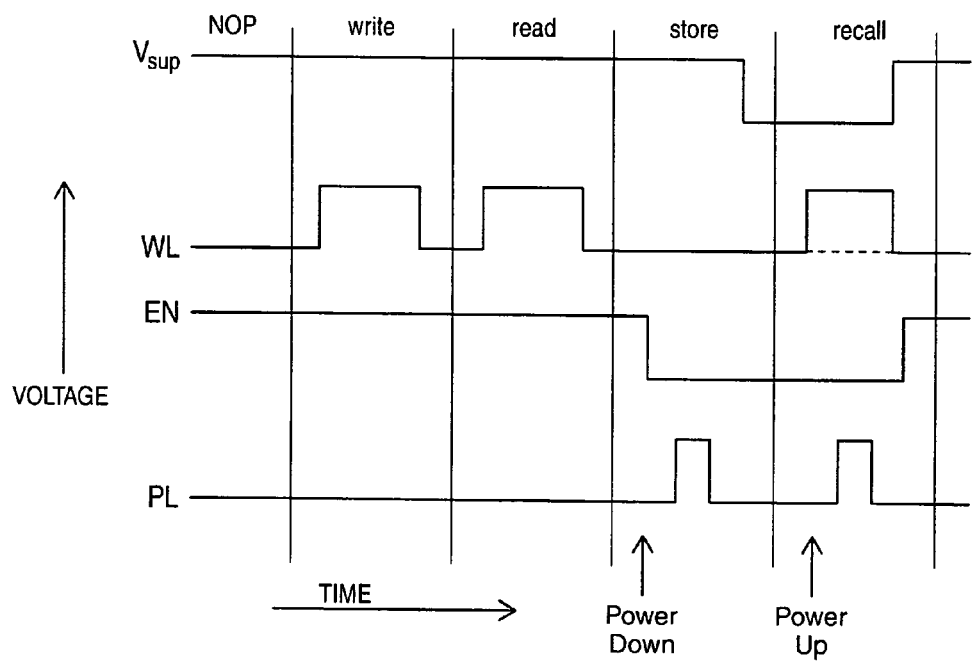
FIG. 2 is a timing diagram for the ferroelectric memory cell of FIG. 1.

FIG. 2 is a timing diagram for the ferroelectric non-volatile SRAM memory cell of FIG. 1. Referring to FIG. 2, the non-volatile SRAM 100 operates as follows. The normal SRAM operation includes the NOP (No Operation), Write, and Read operations. During normal operation, EN is high so that transistors 116 and 118 are on and ferroelectric capacitors 112 and 114 are shorted so that signals on nodes 109 and 110 do not affect the capacitors. Transistors 122 and 124 are turned off, isolating capacitors 112 and 114 from the plate line. The SRAM latch 150 works as a conventional 6-transistor SRAM cell during normal operation time. During the NOP operation, the signal WL on word line 130 is low, transistors 106 and 108 are turned off, and any data is latched between inverters 102 and 103. During the Write operation, the WL signal is high, transistors 106 and 108 are turned on, and the data signals BL and BL* pass to latch 150. During the Read operation, the WL signal is high, transistors 106 and 108 are turned on, and data latched on latch 150 passes to BL and BL*.

When an external control circuit 512, 513 (FIG. 5) senses a power down signal, it forces the EN signal to be low first, and then pulses the signal PL on the plate line. When EN is low, transistors 116 and 118 are off and transistors 122 and 124 are on, so that the voltage between node 109 and plate line 146 will drop across capacitor 112 and the voltage between node 110 and plate line 146 will drop across capacitor 114. This causes the data on nodes 109 and 110 to be stored on capacitors 112 and 114, respectively. As known in the art, the signals on nodes 109 and 110 in normal operation are complementary; thus, the signals stored on capacitors 112 and 114 are complementary. That is, if one is high, the other is low, and vice-versa. After the power is completely down, the ferroelectric capacitors 112 and 114 hold the data via the ferroelectric remnant polarization.

When the external control circuit senses a power up signal, the plate line signal PL is pulsed while EN is kept low. Because capacitors have different polarizations, nodes 109 and 110 will generate a voltage difference, which depends on the capacitance ratio of capacitors 112 or 114 to the capacitances off nodes 109 or 110, respectively. After $V_{sup}$ becomes high, this voltage difference will be enlarged so that a lower voltage becomes data "0" and a higher voltage becomes data "1". Thus, the data stored in the ferroelectric capacitor has been restored to nodes 109 and 110, the EN signal is set to high again, and the cell goes back to its normal operation.

From simulation results, we have found that the recall process is destructive, which means that data in capacitors 112 and 114 is destroyed after the pulse is applied on PL. However, the data will be automatically be recovered after $V_{sup}$ becomes high while EN is still low. During this recall operation, WL can be either high or low, depending on how much capacitance is desired on nodes 109 and 110. By turning on WL, the bit line capacitance will show on nodes 109 and 110. However, if there is enough capacitance on nodes 109 and 110 already, it is not necessary to turn on WL.

Figure 3:
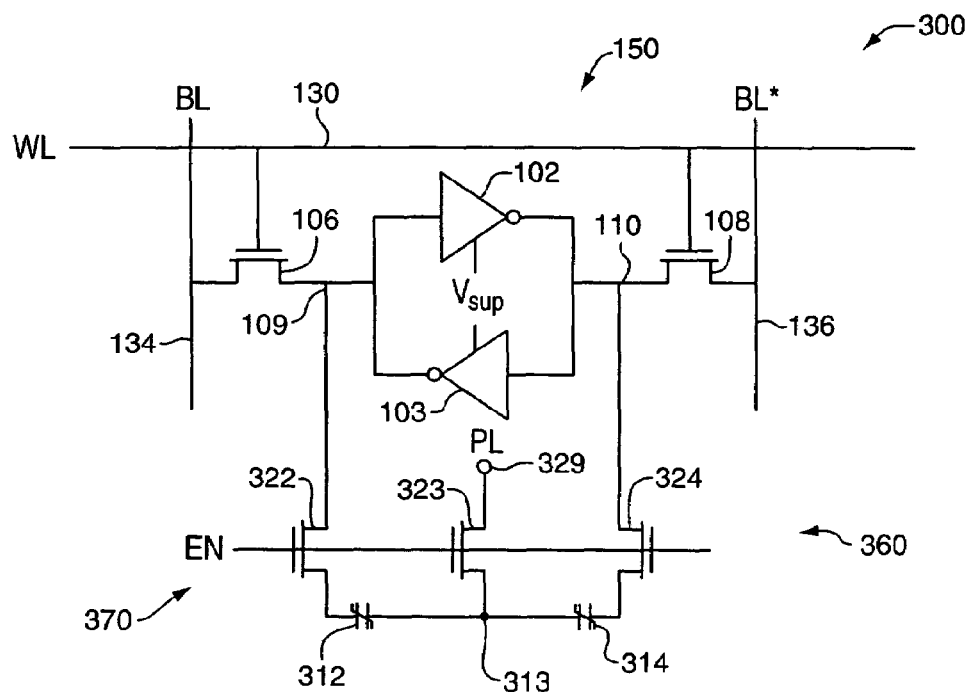
FIG. 3 is an electrical circuit diagram of another preferred embodiment of a non-volatile ferroelectric memory cell according to the invention.

FIG. 3 is another electrical schematic diagram of an alternative embodiment 300 of a non-volatile SRAM cell using two ferroelectric capacitors. In this embodiment, latch 150, transistors 106 and 108, and their connections remain the same as for the embodiment 100 of FIG. 1, so they are numbered the same. The ferroelectric portion 360 includes capacitors 312 and 314 and switches 322, 323, and 324, which are preferably n-channel MOSFETS. One source/drain of transistor 322 is connected to node 109 and the other source/drain is connected to one electrode of capacitor 312. The other electrode of capacitor 312 is connected to node 313. One source/drain of transistor 324 is connected to node 110 and the other source/drain is connected to one electrode of capacitor 314. The other electrode of capacitor 314 is connected to node 313. Node 313 is connected to one source/drain of transistor 323, and the other source/drain of transistor 323 is connected to the plate line signal source 329. When EN is high, transistors 322, 323, and 324 are turned on; when EN is low, transistors 322, 323, and 324 are turned off. As indicated above, transistor 322 and capacitor 312 are connected in series, and transistor 324 and capacitor 314 are connected in series in this embodiment. Transistor 323 comprises a switch system for isolating capacitors 312 and 314 from all other ferroelectric capacitors in memory 500 (FIG. 5) when data is not being transferred between the ferroelectric portion 360 and the SRAM portion 150.

Figure 4:
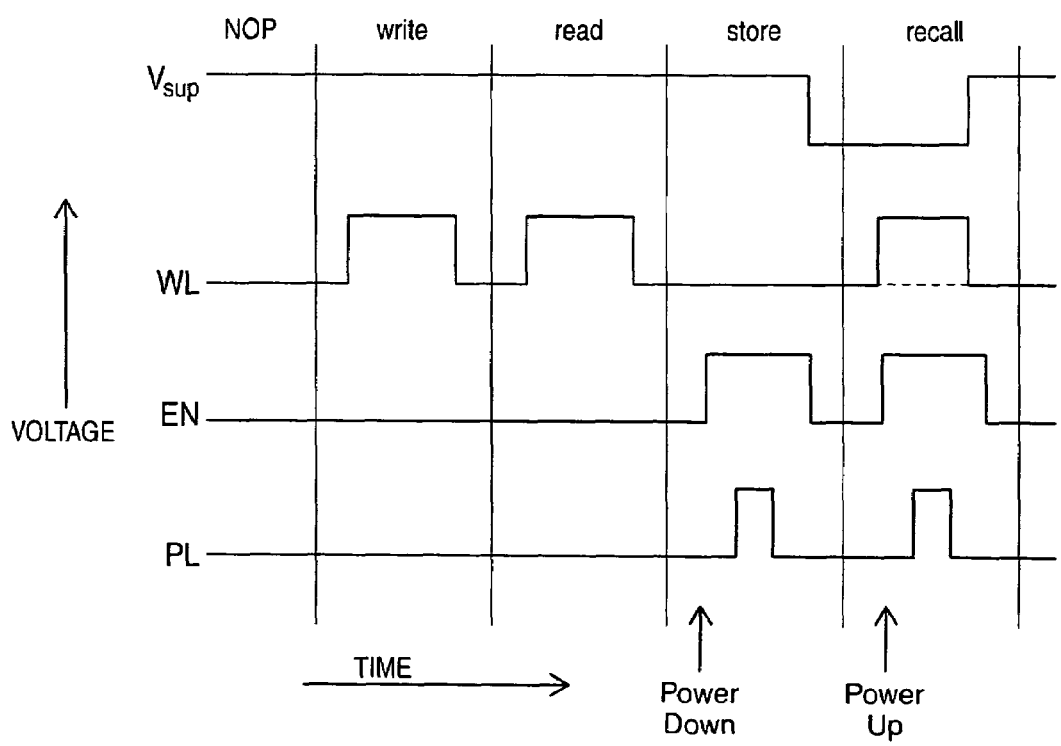
FIG. 4 is a timing diagram for the ferroelectric memory cell of FIG. 1.

FIG. 4 is a timing diagram for the ferroelectric non-volatile SRAM memory cell of FIG. 3. Referring to FIG. 4, the non-volatile SRAM 300 operates as follows. As before, the normal SRAM operation includes the NOP (No Operation), Write, and Read operations. During normal operation, EN is low so that transistors 322, 323, and 324 are off and ferroelectric capacitors 112 and 114 are totally isolated from any signals. The SRAM latch 150 works as a conventional 6-transistor SRAM cell during normal operation time. During the NOP operation, the signal WL on word line 130 is low, transistors 106 and 108 are turned off, and any data is latched between inverters 102 and 103. During the Write operation, the WL signal is high, transistors 106 and 108 are turned on, and the data signals BL and BL* pass to latch 150. During the Read operation, the WL signal is high, transistors 106 and 108 are turned on, and data latched on latch 150 passes to BL and BL*.

When an external circuit 512, 513 (FIG. 5) senses a power down signal, it forces the EN signal to be high first, and then pulses the signal PL on plate line 329. When EN is high, transistors 322, 323, and 324 are turned on so that the voltage between node 109 and plate line 329 will drop across capacitor 312, and the voltage between node 110 and the plate line 329 will drop across capacitor 314. This causes the data on nodes 109 and 110 to be stored on capacitors 312 and 314, respectively. As known in the art, the signals stored on capacitors 312 and 314 are complementary. That is, if one is high, the other is low, and vice-versa. Just before or at the same time that the power is completely down, the EN signal returns low and ferroelectric capacitors 312 and 314 hold the data via their remnant ferroelectric polarization.

When the external circuit senses a power up signal, it forces the EN signal to be high first, and then pulses the signal PL on plate line 329. Because capacitors 312 and 314 have different polarizations, nodes 109 and 110 will be at different voltages, which depend on the capacitance ratio of capacitors 312 or 314 to the capacitances connected to nodes 109 or 110, respectively. After $V_{sup}$ becomes high, this voltage difference will be enlarged so that the lower voltage becomes data "0" and the higher voltage becomes data "1". In this way, the data stored in the ferroelectric capacitors is restored to nodes 109 and 110. Then the EN signal is set low again and the cell goes back to its normal operation.

From simulation results, we have found that the recall process is destructive, which means that data in capacitors 312 and 314 is destroyed after the pulse is applied on PL. However, the data will be automatically be recovered after $V_{sup}$ becomes high while EN is still high. During this recall operation, WL can be either high or low, depending on how much capacitance is desired on nodes 109 and 110. By turning on WL, the bit line capacitance will show on nodes 109 and 110. However, if there is enough capacitance on nodes 109 and 110 already, it is not necessary to turn on WL.

Figure 5:
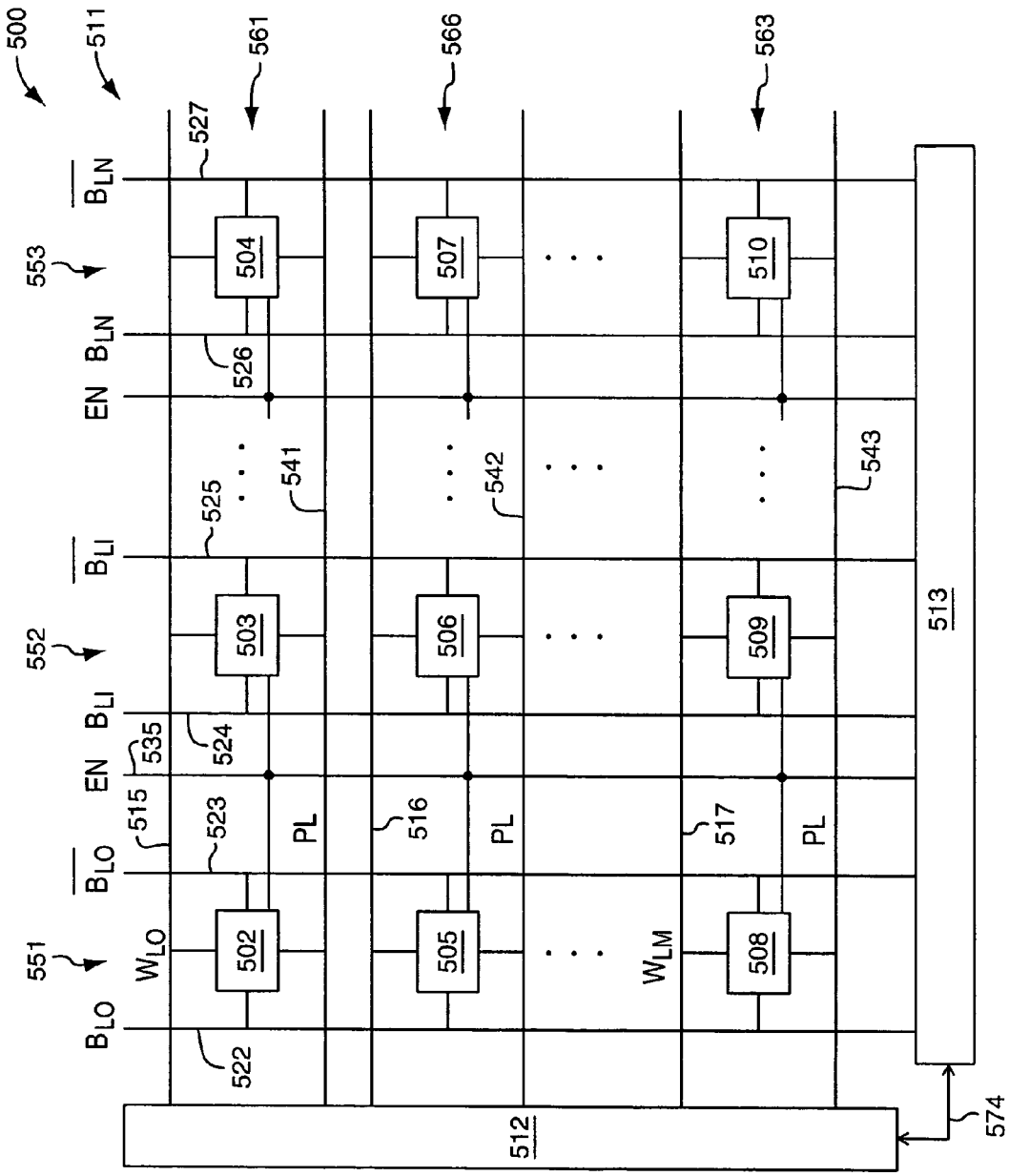
FIG. 5 is a block diagram of a preferred embodiment of a ferroelectric memory according to the invention that can utilize the memory cells of FIGS. 1 and 3.

FIG. 5 is a block diagram of a preferred embodiment of a ferroelectric memory 500 according to the invention that can utilize the memory cells of FIGS. 1 and 3. Memory 500 includes an array 511 of memory cells 502–510, external control circuitry 512 and 513, and connecting wiring that includes word lines 515, 516, 517, bit lines 522, 523, 524, 525, 526, and 527, enable lines 535 and 536, plate lines 541, 542, and 543, and synchronization connectors 574. Control circuitry includes row control circuitry 512 and column control circuitry 513. Each of memory cells 502, 503, 504, 505, 506, 507, 508, 509, and 510 comprises a memory cell circuit 100 as shown in FIG. 1, or alternatively a memory cell circuit as shown in FIG. 3. The memory cells 502–510 are arranged in rows 561, 562, and 563, and columns 551, 552, and 553. As known in the art, there may be many more rows and columns as indicated by the dots. The connections to the various control signals are shown in FIGS. 1 and 3. In the embodiment 500 of FIG. 5, the enable lines 535 and 536 run parallel to the bit lines, and the plate lines 541, 542, and 543 run parallel to the word lines, though this may be reversed, or both the enable lines and plate lines may run parallel, or some other manner of connecting the enable signals and plate signals to the cells may be used. Further, in this embodiment, one enable line is shared by neighboring columns of cells, while each plate line serves a separate row of cells, though other arrangements, such as rows or columns sharing plate lines or each enable line serving a single row or column may be used. That is, it should be understood that FIG. 5 is exemplary, and many other architectures may be used to connect the memory cells to the control logic 512 and 513.

A feature of the invention is that the non-volatile SRAM is not only more reliable than the prior art non-volatile SRAMs, but is also simpler in architecture. The memory architecture of embodiment 100 in FIG. 1 includes one less input to the ferroelectric portion of the cell than the prior art architecture, which includes a ground input as well as two clocked inputs. The architecture of the embodiment 300 of FIG. 3 not only includes only two inputs to the ferroelectric portion of the cell, but includes one less transistor than the prior art non-volatile SRAM memory cells. Further, the fact that all the transistors utilize the same clocked input makes the layout of the cell much simpler.

There has been described novel electronic nonvolatile SRAM memory architectures utilizing ferroelectric nonvolatile storage portions. Now that the manner of isolating the ferroelectric elements and various memory architectures of the cells and the memory have been described, those skilled in the electronics arts may make many variations. It should be understood that the particular embodiments shown in the drawings and described within this specification are for purposes of example and should not be construed to limit the invention, which will be described in the claims below. Further, it is evident that those skilled in the art may now make numerous uses and modifications of the specific embodiments described, without departing from the inventive concepts. It is also evident that the methods recited may, in many instances, be performed in a different order, or equivalent components may be used in the memories, and/or equivalent processes may be substituted for the various processes described. Consequently, the invention is to be construed as embracing each and every novel feature and novel combination of features present in and/or possessed by the invention herein described.

What is claimed is:

1. A non-volatile memory comprising a plurality of memory cells, each memory cell including: a SRAM memory cell portion and a ferroelectric memory cell portion including a ferroelectric element;

said memory including a data transfer circuit for transferring data from said SRAM cell portion to said ferroelectric memory cell portion when said memory is turned off and for transferring data from said ferroelectric memory cell portion to said SRAM memory cell when said memory is turned on; and said ferroelectric memory cell portion including a switch system for isolating said ferroelectric element from the ferroelectric elements in all other said memory cells when said data is not being transferred.

2. A non-volatile memory as in claim 1 wherein said ferroelectric element is a capacitor.

3. A non-volatile memory as in claim 1 wherein said switch system comprises a transistor.

4. A non-volatile memory as in claim 1 wherein each of said ferroelectric memory cell portions include a first ferroelectric capacitor, a second ferroelectric capacitor, a first switch and a second switch, and wherein said first switch isolates said first ferroelectric capacitor and said second switch isolates said second ferroelectric capacitor.

5. A non-volatile memory as in claim 4 wherein said first ferroelectric capacitor and said first switch are connected in parallel, and said second ferroelectric capacitor and said second switch are connected in parallel.

6. A non-volatile memory cell as in claim 4 wherein said first ferroelectric capacitor and said first switch are connected in series, and said second ferroelectric capacitor and said second switch are connected in series.

7. A non-volatile memory as in claim 1 wherein said memory includes a plate line and said switch is connected between said ferroelectric element and said plate line.

8. A non-volatile memory comprising a plurality of memory cells, each memory cell including a SRAM memory cell portion and a ferroelectric memory cell portion including a ferroelectric element, said ferroelectric memory cell portion including a switch system for permitting said ferroelectric element to be isolated from the ferroelectric elements in all other of said memory cells.

9. A non-volatile memory as in claim 8 wherein said ferroelectric element is a capacitor.

10. A non-volatile memory as in claim 8 wherein said switch system comprises a transistor.

11. A non-volatile memory comprising a plurality of memory cells, each memory cell including: a SRAM memory cell portion and a ferroelectric memory cell portion including a ferroelectric element;

said memory including a data transfer circuit for transferring data from said SRAM cell portion to said ferroelectric memory cell portion when said memory is turned off and for transferring data from said ferroelectric memory cell portion to said SRAM memory cell when said memory is turned on; and said ferroelectric memory cell portion including a switch system for creating a short circuit across said ferroelectric element when said SRAM portion is operating normally.

12. A non-volatile memory as in claim 11 wherein said ferroelectric element is a capacitor.

13. A non-volatile memory as in claim 12 wherein said switch system comprises a transistor.

14. A method of operating a non-volatile SRAM memory cell in a memory containing a plurality of said cells, said method comprising:

providing a SRAM memory cell portion and a ferroelectric memory cell portion including a ferroelectric element;

transferring data between said SRAM memory cell portion and said ferroelectric memory cell portion; and isolating said ferroelectric element from all other ferroelectric elements in said memory when said data is not being transferred.

15. A method as in claim 14 wherein said ferroelectric element is a ferroelectric capacitor having two electrodes, said method further including shorting out the two electrodes of said ferroelectric element while said SRAM portion is operating normally.

* * * * *